United States Patent
Rowell et al.

(10) Patent No.: US 10,079,646 B2
(45) Date of Patent: Sep. 18, 2018

(54) SYSTEM AND METHOD FOR TESTING ANTENNA ARRAYS

(71) Applicant: Rohde & Schwarz GmbH & Co. KG, Munich (DE)

(72) Inventors: Corbett Rowell, Munich (DE); Hendrik Bartko, Unterhaching (DE); Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/400,314

(22) Filed: Jan. 6, 2017

(65) Prior Publication Data

US 2018/0102856 A1    Apr. 12, 2018

(30) Foreign Application Priority Data

Oct. 6, 2016   (EP) ..................................... 16192520
Nov. 16, 2016  (EP) ..................................... 16199018

(51) Int. Cl.
| H04B 1/38 | (2015.01) |
| H04L 5/16 | (2006.01) |
| H04B 17/00 | (2015.01) |
| H04L 12/26 | (2006.01) |
| H04B 7/0413 | (2017.01) |

(52) U.S. Cl.
CPC ........... *H04B 17/00* (2013.01); *H04B 7/0413* (2013.01); *H04L 43/12* (2013.01)

(58) Field of Classification Search
CPC ....... H04B 17/00; H04B 7/0413; H04L 43/12; H01Q 3/267
USPC .................. 375/219, 221, 224, 260; 342/175
See application file for complete search history.

(56) References Cited

U.S. PATENT DOCUMENTS

2015/0276919 A1* 10/2015 Matsumura ............ H01Q 3/267
                                                    342/175
2016/0269093 A1    9/2016 Seol et al.

* cited by examiner

*Primary Examiner* — Phuong Phu
(74) *Attorney, Agent, or Firm* — Ditthavong & Steiner, P.C.

(57) ABSTRACT

A system for testing and/or calibrating an antenna array. The system comprises a device under test comprising the antenna array and at least one active radio frequency device for transmitting a test signal being known and always the same on each of at least two signal paths, and a measurement device comprising at least one probe for receiving the test signal on each of the at least two signal paths. The test signal is a non-repeatable one.

14 Claims, 3 Drawing Sheets

SYSTEM AND METHOD FOR TESTING ANTENNA ARRAYS

PRIORITY

This application claims priority of European patent applications EP 16 192 520.1 filed on Oct. 6, 2016 and EP 16 199 018.9 filed on Nov. 16, 2016, which are incorporated by reference herewith.

FIELD OF THE INVENTION

The invention relates to a system and a method for testing antenna arrays. Alternatively or additionally, the inventive system and method can be used for calibrating such antenna arrays.

BACKGROUND OF THE INVENTION

Generally, in times of an increasing number of wireless communication applications employing MIMO (Multiple Input Multiple Output) systems such as LTE (Long Term Evolution), there is a growing need of a testing system and a testing method for testing devices under test applying such systems, respectively the corresponding antenna arrays. In this context, especially the calibration of said antenna arrays is likewise increasingly gaining importance.

US 2016/0269093 A1 discloses a communication method and apparatus using analog and digital beamforming with respect to MIMO. Nevertheless, the aforementioned document does not consider testing or calibrating an antenna array, which is essential for ensuring the proper functioning of the device under test, respectively the wireless communication.

Accordingly, there is a need to provide a system and a method for testing and/or calibrating antenna arrays with special respect to wireless communication applications employing MIMO.

This is solved by the features of claim 1 for the system and claim 9 for the method. The dependent claims contain further developments.

SUMMARY OF THE INVENTION

According to a first aspect of the invention, a system for testing and/or calibrating an antenna array is provided. The system comprises a device under test comprising the antenna array and at least one active radio frequency device for transmitting a test signal being known and always the same or at least partially the same on each of at least two signal paths, and a measurement device comprising at least one probe for receiving the test signal on each of the at least two signal paths. In addition to this, said test signal is advantageously a non-repeatable one at least for the time of testing and/or calibrating.

According to a first preferred implementation form of the first aspect, with respect to the test signal, at least one of amplitude, frequency, phase and spatial dependency changes over time. Advantageously, in the face of various delays occurring within the at least two signal paths, each of the at least two signal paths is unambiguously identifiable. In other words, within each of the at least two signal paths, the respective signal running from the at least one active radio frequency device to the corresponding antenna is delayed, wherein this delay may not be constant in comparison with the other signal paths. In this case, an unequivocal identification of each of the at least two signal paths is ensured. Further advantageously, the test signal is a chirp signal.

According to a further preferred implementation form of the first aspect, the at least one probe measures the output of each of the at least two signal paths at a defined time interval.

According to a further preferred implementation form of the first aspect, the measurement device collects the measurement data with respect to each of the at least two signal paths.

According to a further preferred implementation form of the first aspect, the measurement device measures the time needed for changing with the position of the at least one probe from one of the at least two signal paths to another one of the at least two signal paths.

According to a further preferred implementation form of the first aspect, on the basis of the corresponding measurements, the measurement device calculates the phase of each of the at least two signal paths and/or the phase difference between each pair of the at least two signal paths and/or the amplitude of each of at least two signal paths and/or the amplitude difference between each pair of the at least two signal paths. In other words, this calculation is performed based on measured data with respect to the output of each of the at least two signal paths, time needed for changing with position of the at least one probe from one of the at least two signal paths to another one of the at least two signal paths, and time interval for measurement of each of the at least two signal paths.

According to a further preferred implementation form of the first aspect, each signal of at least one pair of the at least two signal paths partially or completely comprises the same signal portions.

According to a further preferred implementation form of the first aspect, the system further comprises a switch matrix for changing the position of the at least one probe from one of the at least two signal paths to another one of the at least two signal paths.

According to a second aspect of the invention, a method for testing and/or calibrating an antenna array is provided. The method uses a device under test comprising the antenna array and at least one active radio frequency device and a measurement device comprising at least one probe. Furthermore, the method comprises the steps of transmitting a test signal being known and always the same or at least partially the same on each of at least two signal paths from the device under test, and receiving the test signal on each of the at least two signal paths with the aid of the at least one probe of the measurement device. Advantageously, the test signal is a non-repeatable one at least for the time of testing and/or calibrating.

According to a first preferred implementation form of the second aspect, with respect to the test signal, at least one of amplitude, frequency, phase and spatial dependency changes over time. Advantageously, in the face of various delays occurring within the at least two signal paths, each of the at least two signal paths is unambiguously identifiable. In other words, within each of the at least two signal paths, the respective signal running from the at least one active radio frequency device to the corresponding antenna is delayed, wherein this delay may not be constant in comparison with the other signal paths. In this case, an unequivocal identification of each of the at least two signal paths is ensured. Further advantageously, the test signal is a chirp signal.

According to a further preferred implementation of the second aspect, the at least one probe measures the output of each of the at least two signal paths at a defined time interval.

According to a further preferred implementation of the second aspect, the measurement device collects the measurement data with respect to each of the at least two signal paths.

According to a further preferred implementation of the second aspect, the measurement device measures the time needed for changing with position of the at least one probe from one of the at least two signal paths to another one of the at least two signal paths.

According to a further preferred implementation of the second aspect, on the basis of the corresponding measurements, the measurement device calculates the phase of each of the at least two signal paths and/or the phase difference between each pair of the at least two signal paths. In other words, this calculation is performed based on measured data with respect to the output of each of the at least two signal paths, time needed for changing with position of the at least one probe from one of the at least two signal paths to another one of the at least two signal paths, and time interval for measurement of each of the at least two signal paths.

According to a further preferred implementation of the second aspect, each signal of at least one pair of the at least two signal paths partially or completely comprises the same signal portions.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Figure 1:
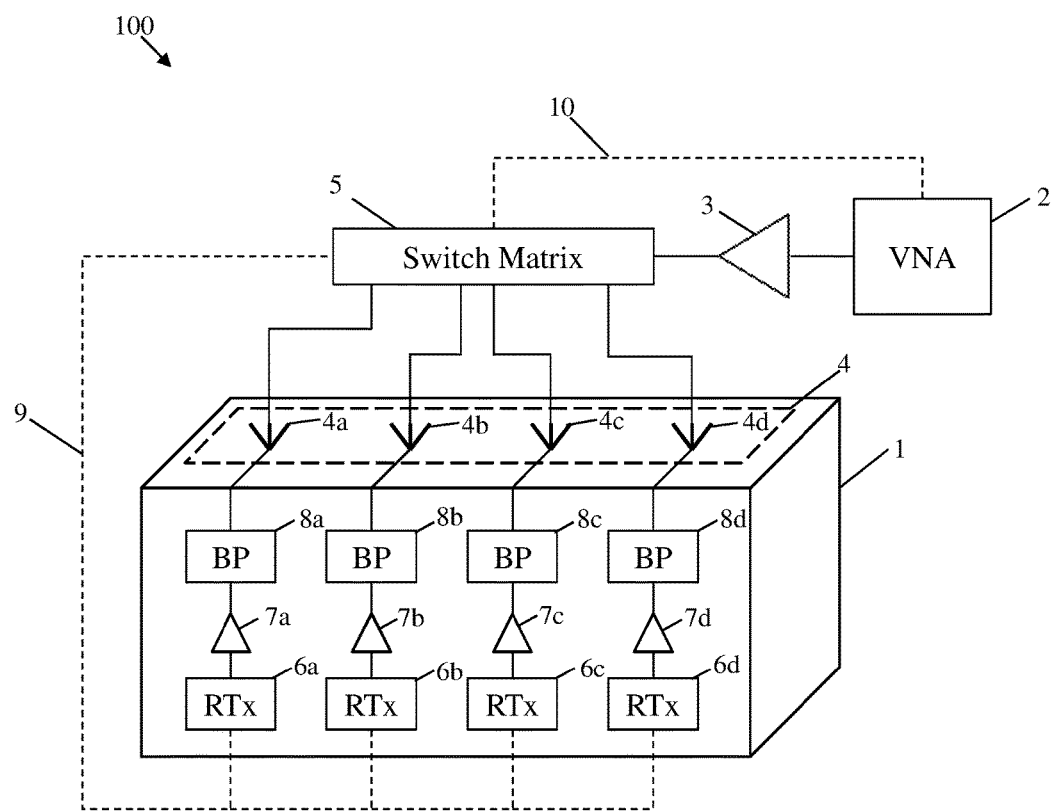
FIG. 1 shows a block diagram of an exemplary embodiment of the inventive system.

From FIG. 1, an exemplary embodiment of the inventive system 100 can be seen. In this exemplary case, the system 100 comprises a device under test 1 comprising an antenna array 4, a measurement device 2, preferably a vector network analyzer, comprising a probe 3, and a switch matrix 5.

The antenna array 4 of the device under test 1 consists of four antennas 4a, 4b, 4c, 4d, which leads to four signal paths, each of which comprises an active radio frequency device 6a, 6b, 6c, 6d, exemplarily a transceiver, an amplifier 7a, 7b, 7c, 7d, and a bandpass 8a, 8b, 8c, 8d.

Furthermore, each of the antennas 4a, 4b, 4c, 4d of the antenna array 4 of the device under test 1 is connected to the switch matrix 5 coupled to the probe 3 which is connected to the measurement device 2, respectively to the vector network analyzer. Advantageously, due to the switch matrix 5, switching between the signal paths for testing and/or calibrating the antenna array 4 is achieved without changing the physical position of the probe 3.

For the purpose of testing the antenna array 4 of the device under test 1, respectively for the purpose of calibrating the corresponding transceivers of each of the antennas 4a, 4b, 4c, 4d of the antenna array 4 to maximize efficiency, a test signal is transmitted on each of the four signal paths. Preferably, said test signal is known, always the same, and a non-repeatable one, preferably a chirp signal or a kind thereof. In other words, with respect to the test signal, at least one of amplitude, frequency, and phase changes over time.

Moreover, the probe 3 measures the output of each of the four signal paths with the aid of the switch matrix 5 at a defined time interval. In order to provide an appropriate trigger condition for the switch matrix 5, the non-repeatable test signal may be fed into each of the active radio frequency devices 6a, 6b, 6c, 6d, respectively into the transceivers, by the switch matrix 5 itself via connection 9. Optionally, it may be advantageous to provide said trigger condition also for the measurement device 2 via connection 10. As a consequence of this, with respect to the system 100, an absolute time basis is obtained, which ensures highly accurate measurements.

As it can be seen, the non-repeatable test signal can be transmitted via a rather low speed connection. Therefore, a cost-intensive implementation of radio frequency ports at the device under test are advantageously not necessary.

In addition, it is to be pointed out that the above-mentioned connection 9 between the switch matrix 5 and the transceivers 6a, 6b, 6c, 6d may be an imaginary connection, which advantageously leads to the fact that an electrical connection to the device under test 1 is not required, and thus testing and/or calibrating the antenna array 4 of the device under test 1 is most time-saving and cost-efficient.

In this context, the test signal is directly implemented into the device under test 1 with the aid of hardware and/or software. Due to the fact that the test signal is known, always the same, and a non-repeatable one, the trigger condition, respectively the absolute time basis, can then be calculated with the aid of the switch matrix 5 or with the aid of the measurement device 2 or the combination thereof.

Moreover, after the output of each of the signal paths has been measured at a defined time interval as already mentioned above, the measurement device 2 collects the corresponding measurement data, wherein the measurement device 2 also measures the time needed for changing with the position of the probe 3 from one of the signal paths to another one of the signal path, respectively the time needed for switching between the signal paths with the aid of the switch matrix 5.

Generally, and in addition to this, it is to be mentioned that in order to advantageously speed up the measurements, if the measurement device comprises multiple input ports and multiple probes, the antennas of the antenna array can be grouped into different groups, wherein the number of groups is preferably equal to the number of input ports, respectively to the number of probes, of the measurement device. Thus, a part of the whole measurement can be parallelized, which allows for a shorter measuring time.

Then, in order to complete the testing of the antenna array 4, respectively the calibration of the corresponding transceivers 6a, 6b, 6c, 6d, on the basis of the above-mentioned measured data with respect to the output of each of the signal paths, time needed for switching between the signal paths, and time interval for measurement of each of the signal paths, the measurement device 2 calculates the phase of each of the signal paths and/or the phase difference between each pair of the signal paths.

Figure 2:
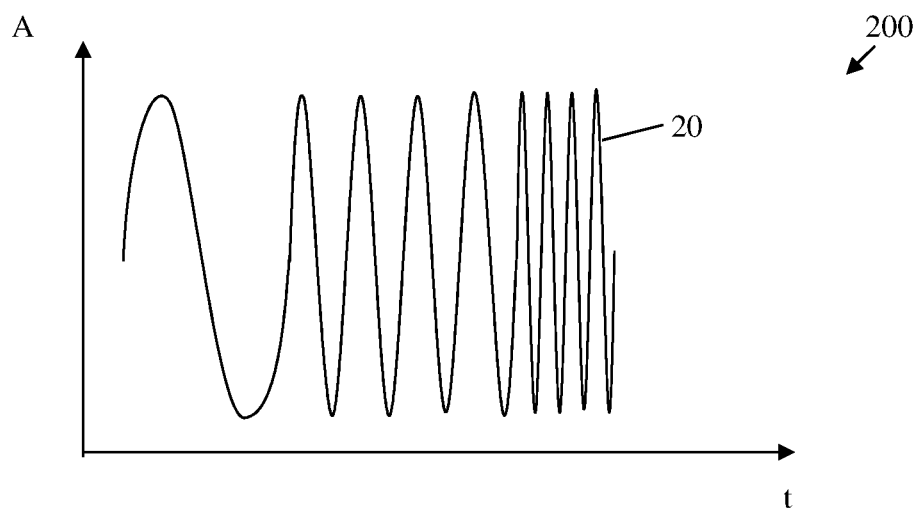
FIG. 2 shows an exemplary test signal, the frequency of which changes over time.

Now, with respect to FIG. 2, an amplitude-time diagram 200 of an exemplary test signal 20 is shown. One can see that whereas the amplitude A of the test signal remains constant, the frequency of the test signal 20 increases over time t. Such a signal is also known as a chirp signal, especially a positive chirp signal due to the increasing frequency.

Figure 3:
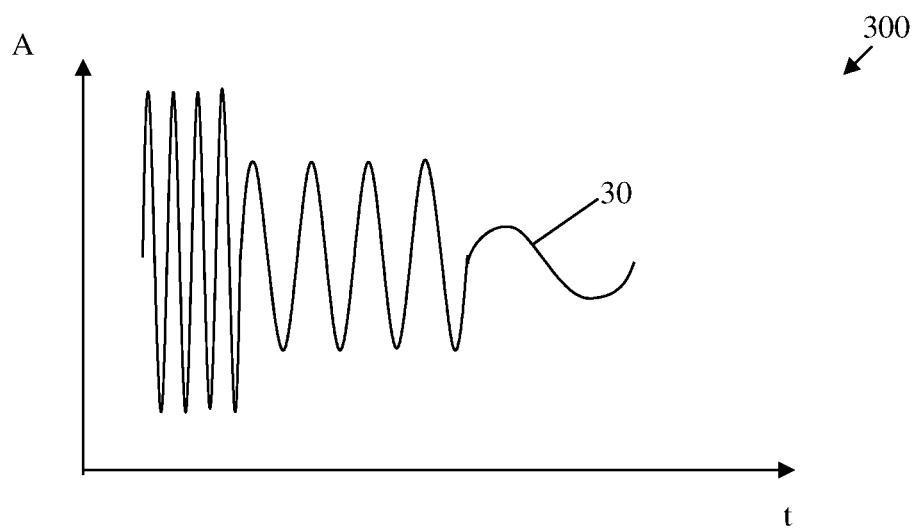
FIG. 3 shows an exemplary test signal, both the frequency and amplitude of which change over time.

Furthermore, FIG. 3 illustrates an amplitude-time diagram 300 of another exemplary test signal 30. As it can be seen, in this case, whereas the Amplitude A decreases over time t, the frequency of the exemplary test signal 30 also decreases over time t. As a consequence of this, one might say that the test signal 30 is a kind of a negative chirp signal.

Figure 4:
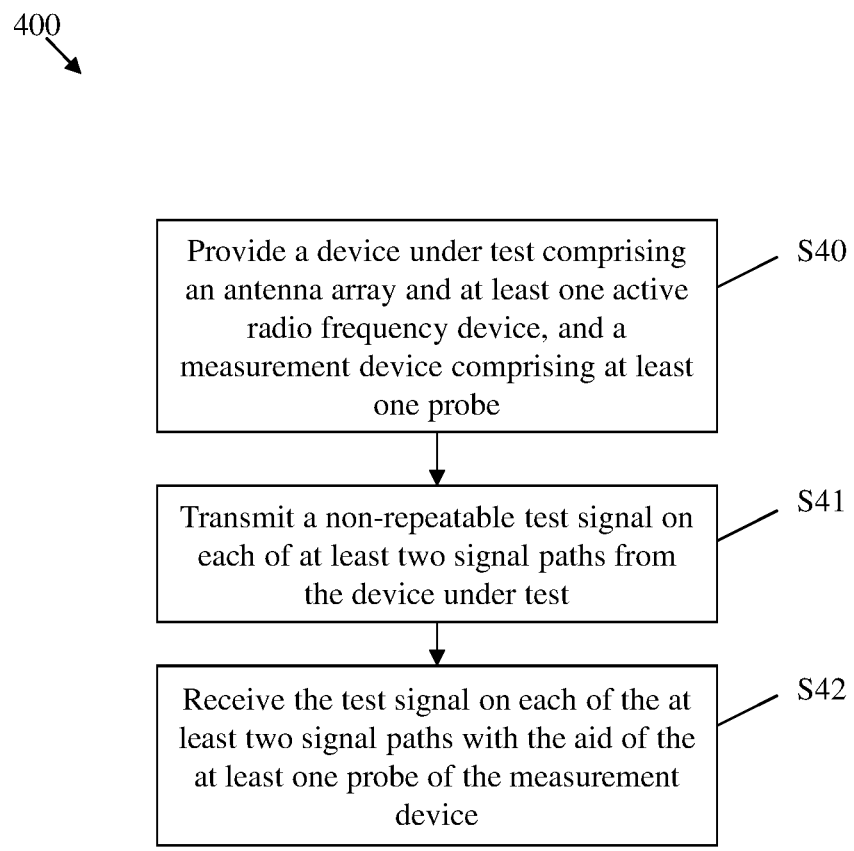
FIG. 4 shows a flow chart of an embodiment of the second aspect of the invention.

Finally, FIG. 4 shows a flow chart 400 of the inventive method. In a first step S40, a device under test comprising an antenna array and at least one active radio frequency device, and a measurement device comprising at least one probe are provided. In a second step S41, a non-repeatable test signal is transmitted on each of at least two signal paths from the device under test. Then, in a third step S42, the test signal on each of the at least two signal paths is received with the aid of the at least one probe of the measurement device.

While various embodiments of the present invention have been described above, it should be understood that they have been presented by way of example only, and not limitation. Numerous changes to the disclosed embodiments can be made in accordance with the disclosure herein without departing from the spirit or scope of the invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed:

1. A system for testing and/or calibrating an antenna array, the system comprising:
    a device under test comprising the antenna array and at least one active radio frequency device for transmitting a test signal being known and always the same or partially the same on each of at least two signal paths,
    a measurement device comprising at least one probe for receiving the test signal on each of the at least two signal paths, and
    a switch matrix for changing a position of the at least one probe from one of the at least two signal paths to another one of the at least two signal paths,
    wherein the test signal is a non-repeatable one for the time of testing and/or calibrating,
    wherein a trigger condition provided for the switch matrix is also provided for the measurement device, and
    wherein the test signal is fed into each of the at least one active radio frequency device by the switch matrix itself.

2. The system according to claim 1,
    wherein with respect to the test signal, at least one of amplitude, frequency, phase and spatial dependency changes over time.

3. The system according to claim 1,
    wherein the at least one probe measures the output of each of the at least two signal paths at a defined time interval.

4. The system according to claim 1,
    wherein the measurement device collects the measurement data with respect to each of the at least two signal paths.

5. The system according to claim 1,
    wherein the measurement device measures the time needed for changing with the position of the at least one probe from one of the at least two signal paths to another one of the at least two signal paths.

6. The system according to claim 1,
    wherein on the basis of the corresponding measurements, the measurement device calculates the phase of each of the at least two signal paths and/or the phase difference between each pair of the at least two signal paths and/or the amplitude of each of at least two signal paths and/or the amplitude difference between each pair of the at least two signal paths.

7. The system according to claim 1,
    wherein each signal of at least one pair of the at least two signal paths partially or completely comprises the same signal portions.

8. A method for testing and/or calibrating an antenna array, the method using a device under test comprising the antenna array and at least one active radio frequency device and a measurement device comprising at least one probe, the method comprising steps of:
    transmitting a test signal being known and always the same or partially the same on each of at least two signal paths from the device under test,
    receiving the test signal on each of the at least two signal paths with the aid of the at least one probe of the measurement device, and
    changing a position of the at least one probe from one of the at least two signal paths to another one of the at least two signal paths with aid of a switch matrix,
    wherein a trigger condition provided for the switch matrix is also provided for the measurement device,
    wherein the test signal is a non-repeatable one for the time of testing and/or calibrating, and
    wherein the test signal is fed into each of the at least one active radio frequency device by the switch matrix itself.

9. The method according to claim 8,
    wherein with respect to the test signal, at least one of amplitude, frequency, phase and spatial dependency changes over time.

10. The method according to claim 8,
    wherein the at least one probe measures the output of each of the at least two signal paths at a defined time interval.

11. The method according to claim 8,
    wherein the measurement device collects the measurement data with respect to each of the at least two signal paths.

12. The method according to claim 8,
    wherein the measurement device measures the time needed for changing with position of the at least one probe from one of the at least two signal paths to another one of the at least two signal paths.

13. The method according to claim 8,
    wherein on the basis of the corresponding measurements, the measurement device calculates the phase of each of the at least two signal paths and/or the phase difference between each pair of the at least two signal paths and/or the amplitude of each of at least two signal paths and/or the amplitude difference between each pair of the at least two signal paths.

14. The method according to claim 8,
wherein each signal of at least one pair of the at least two signal paths partially or completely comprises the same signal portions.

* * * * *